US008978900B2

(12) United States Patent
Westphall et al.

(10) Patent No.: US 8,978,900 B2
(45) Date of Patent: Mar. 17, 2015

(54) BULK RAIL BRACKET

(75) Inventors: Paul E. Westphall, Tomball, TX (US); Anthony A. Tsuei, Houston, TX (US); Andrew James Phelan, Magnolia, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 770 days.

(21) Appl. No.: 12/782,327

(22) Filed: May 18, 2010

(65) Prior Publication Data

US 2011/0284706 A1 Nov. 24, 2011

(51) Int. Cl.
*A47F 7/00* (2006.01)
*H05K 7/14* (2006.01)

(52) U.S. Cl.
CPC .................................... *H05K 7/1489* (2013.01)
USPC .......................... 211/26; 211/189; 361/679.02

(58) Field of Classification Search
USPC ................ 211/26, 189, 26.1, 26.2, 87.01, 40, 211/41.12, 41.17, 41.18; 312/223.1, 223.2, 312/223.3; 361/679.31, 679.32, 679.33, 361/679.39, 679.02
See application file for complete search history.

(56) References Cited

U.S. PATENT DOCUMENTS

| 2,936,899 | A | * | 5/1960 | Tashman | 211/85.4 |
|---|---|---|---|---|---|
| 3,222,117 | A | * | 12/1965 | Schwartz | 312/264 |
| 3,655,063 | A | * | 4/1972 | Landry | 211/41.2 |
| 4,588,096 | A | * | 5/1986 | Story et al. | 211/126.15 |
| 5,724,227 | A | * | 3/1998 | Hancock et al. | 361/679.32 |
| 6,069,789 | A | * | 5/2000 | Jung | 361/679.32 |
| 6,201,692 | B1 | * | 3/2001 | Gamble et al. | 361/679.31 |
| 6,238,026 | B1 | * | 5/2001 | Adams et al. | 312/223.2 |
| 6,247,944 | B1 | * | 6/2001 | Bolognia et al. | 439/157 |
| 6,373,695 | B1 | * | 4/2002 | Cheng | 361/679.39 |
| 6,456,489 | B1 | * | 9/2002 | Davis et al. | 361/679.58 |
| 6,483,709 | B1 | * | 11/2002 | Layton | 361/724 |
| 6,513,770 | B1 | * | 2/2003 | Franz et al. | 248/200 |
| 6,590,766 | B2 | * | 7/2003 | Sheng-Hsiung et al. | 361/679.33 |
| 6,732,662 | B2 | * | 5/2004 | Welch et al. | 108/109 |
| 6,736,276 | B2 | * | 5/2004 | Broome | 211/26 |
| 6,796,833 | B2 | | 9/2004 | Baker | |
| 6,948,691 | B2 | | 9/2005 | Brock et al. | |
| 7,123,485 | B1 | * | 10/2006 | Henderson | 361/724 |
| 7,298,612 | B2 | | 11/2007 | Malone | |
| 7,369,404 | B2 | * | 5/2008 | Han et al. | 361/679.33 |
| 7,675,742 | B2 | | 3/2010 | Wu et al. | |
| D639,010 | S | * | 5/2011 | Barnts et al. | D34/21 |
| 2002/0020683 | A1 | * | 2/2002 | Broome | 211/26 |
| 2009/0294606 | A1 | * | 12/2009 | Chen | 248/205.1 |
| 2010/0000950 | A1 | * | 1/2010 | Malekmadani | 211/26 |
| 2012/0112611 | A1 | * | 5/2012 | Chen et al. | 312/223.2 |

* cited by examiner

*Primary Examiner* — Korie H Chan

(74) *Attorney, Agent, or Firm* — Greer, Burns & Crain, Ltd.

(57) ABSTRACT

A bulk rail bracket including at least three horizontally-oriented and vertically aligned support shelf rows, wherein each pair of consecutive support shelf rows is positioned such that the two support shelf rows in the pair are spaced by a height that is approximately a multiple of a rack unit size.

13 Claims, 7 Drawing Sheets

BULK RAIL BRACKET

BACKGROUND OF THE INVENTION

The present invention relates generally to brackets used within rack mount systems, and more specifically to sheet metal brackets used to guide and secure servers into server rack mount systems.

A rack unit (commonly referred to as a "U") is an Electronics Industries Alliance ("EIA") standard measuring unit for rack components and rack mount systems. The majority of modern network equipment and servers (i.e., rack components) are designed to fit and mount into these rack mount systems. A single rack unit is equal to 1.75 inches in height. The size of a rack component is frequently described as a number of rack units or "U"s. For example, a rack component having a single rack unit is often referred to as "1U", while a rack component having two rack units is referred to as "2U," and so on. To calculate the internal usable space of a rack enclosure of a rack mount system, one would simply multiply the total number amount of rack units by 1.75 inches. For example, a 42U (i.e., 42 unit) rack enclosure would have 73.50 inches of internal space (42×1.75 inches).

The width of a rack mount system is typically either 19 or 23 inches. There are also half-rack units that fit in a certain number of rack units, but occupy only half the width of a 19 or 23 inch rack mount system. Such half-rack units are commonly used when a rack component does not require the entire width of the rack mount system. In some cases, two half-rack units may be mounted side-by-side to occupy a full rack unit space.

Notably, the height of a rack component installed in a rack mount enclosure is not an exact multiple of 1.75 inches. Indeed, to allow for space between adjacent rack components, each component is approximately $\frac{1}{32}$ (~0.03) inches less in height than the full number of rack units would suggest. Therefore, a 1U component would be approximately 1.72 inches high, leaving a gap of ~0.03 inches. Therefore, the total gap between two units is ~0.06 inches (~0.03 inches from the top unit and ~0.03 inches from the bottom unit). The gap provides for some room above and below the installed component so it may be removed without binding on the adjacent components.

Typically, data center managers calculate the rack enclosure height needed by determining the optimal rack unit usage. For example, if a data center manager knows that they will be adding a significant number of 2U servers, they would likely estimate that a 42U rack enclosure would provide enough internal height for around 20 servers, while still providing room for a small number of other 1U or 2U devices typically included within a rack enclosure (e.g., patch panels).

Traditionally, when a rack component (e.g., a server) is installed into the rack enclosure, two brackets are installed in the rack enclosure (each is installed on a pair of vertical columns associated with each of a right and left rack wall such that the brackets face each other). The brackets are configured to provide a ledge or shelf to support the component (one for the left side of the component and one for the right side of the component). These shelves allow for the component to slide into the rack enclosure, and also provide support for the component. The brackets are typically mounted within the rack enclosure using fasteners (e.g., screws). In many rack enclosures, four screws are used to secure a single bracket to a wall of the rack enclosure. Once the component is slid over the shelves and into position within the rack enclosure, additional fasteners are used to secure the component to the brackets (and therefore to the walls of the rack enclosure). To accommodate components of various U sizes, the brackets are vertically spaced as needed within the rack enclosure.

DETAILED DESCRIPTION

Figure 1:
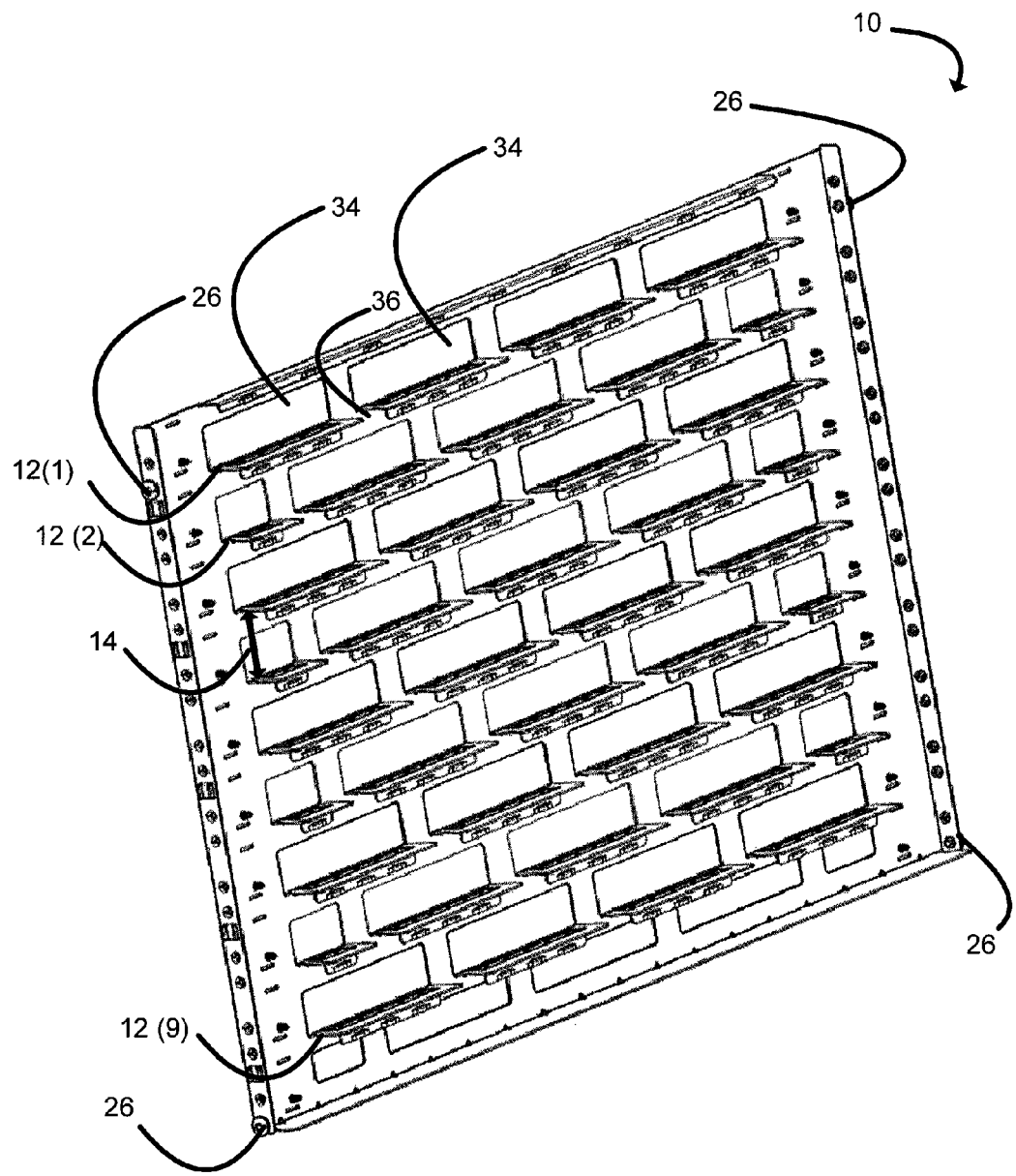
FIG. 1 is a front perspective view of a bulk rail bracket of a first embodiment of the present invention.
Figure 2:
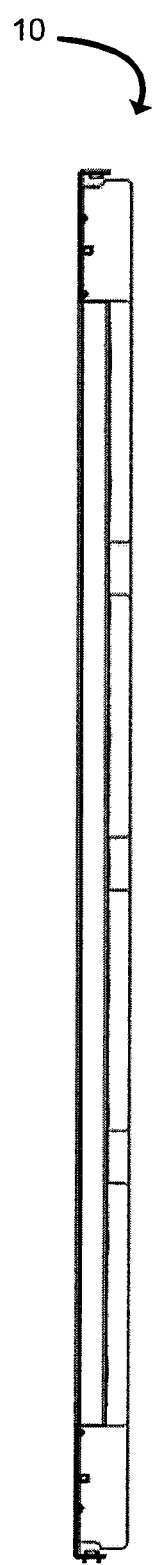
FIG. 2 is a top view of the bulk rail bracket of FIG. 1.
Figure 3:
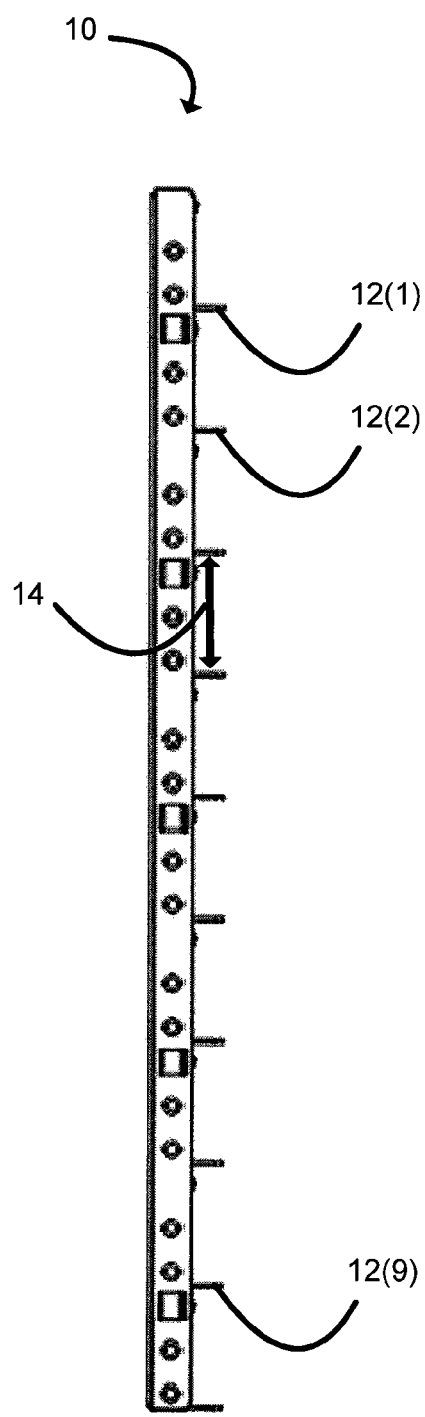
FIG. 3 is a left side view of the bulk rail bracket of FIG. 1, the right side view being a mirror image of the left side view.
Figure 4:
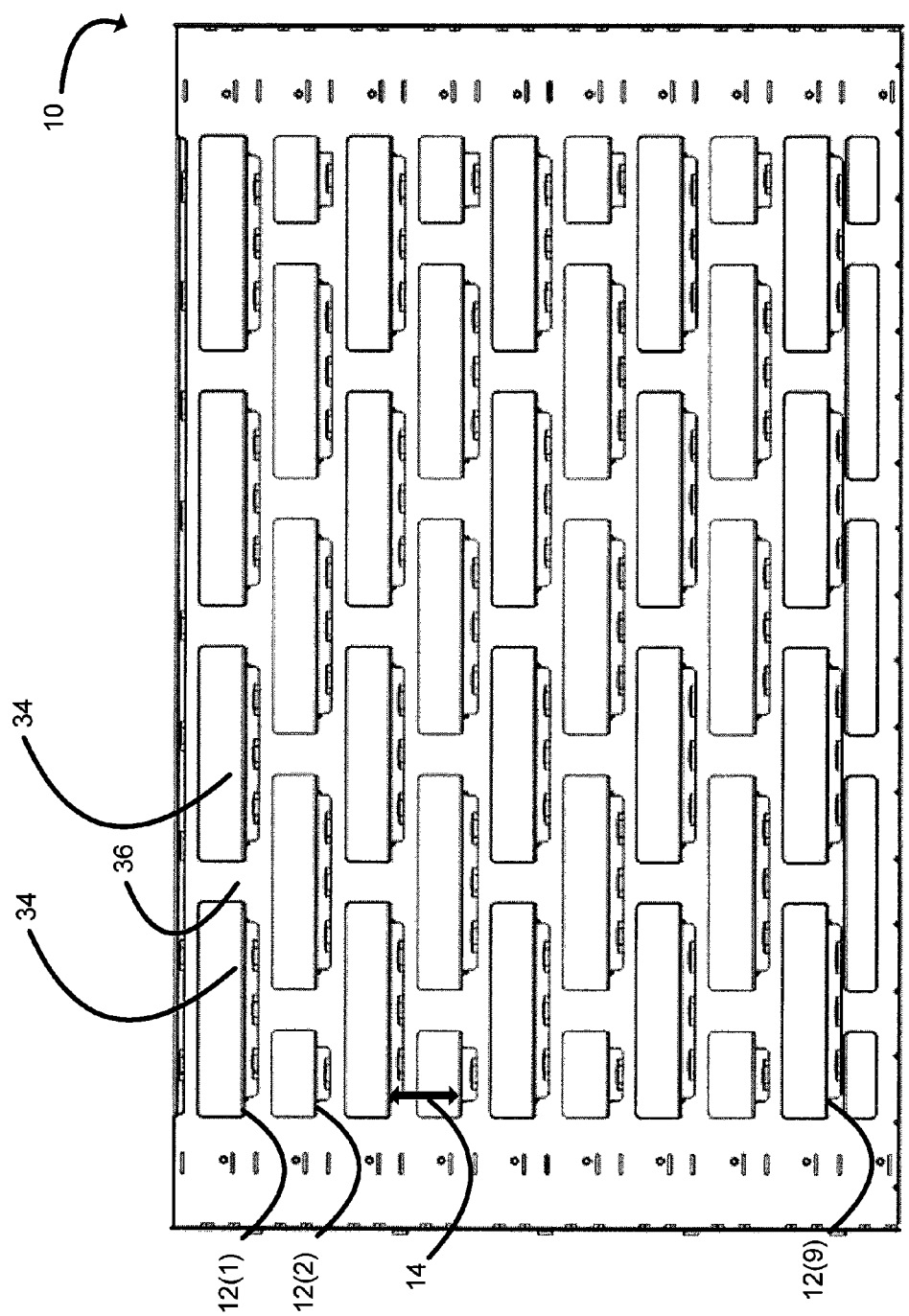
FIG. 4 is a front view of the bulk rail bracket of FIG. 1.

Under the traditional techniques used to install components within a rack component system, often a large number of brackets and fasteners are required for installation. Consider for example a 42U sized rack configured to house 42 1U-sized components. As described above, each component requires two brackets, requiring a total of 84 brackets. Further, each bracket uses four screws to secure itself to the rack wall, resulting in a total of 336 screws required to complete installation of all the components within the rack enclosure.

The present invention provides a rack mount system having at least two bulk rail brackets, which allows multiple servers or other components to be mounted in a rack enclosure with a reduced number of brackets and fasteners than those required in the example discussed above. Indeed, in one embodiment of the present invention, the desired configuration as discussed the example above (i.e., having 42 1U-size components installed in a 42U-sized rack) would require only two bulk rail brackets and as few as eight fasteners. These are greatly reduced hardware requirements as compared to the 84 brackets and 336 screws required when using the traditional approach. As such, the present bulk rail system provides for savings in the cost of hardware and reduces labor time required for installation of such components.

Embodiments of the present bulk rail bracket have at least three horizontally-oriented and vertically aligned support shelf rows. Referring now to FIGS. 1-4, a bulk rail bracket 10 is shown, which has nine horizontally-oriented and vertically aligned support shelf rows 12 (in FIGS. 1, 3, and 4, the first two rows are labeled 12(1) and 12(2) respectively, and the last row is labeled 12(9)). The support shelf rows 12 are configured such that each pair of rows is positioned so that the two support shelf rows in the pair are spaced by a height 14 that is approximately a multiple of a rack unit size. As described above, the conventional rack unit size is 1.75 inches, although the present invention is not limited to such a size. In the embodiment shown, the multiple is one (i.e., the height 14 is a single rack unit size). As such, the bulk rail bracket 10 shown in FIGS. 1-4 supports installation of ten 1U (one rack unit size) rack components (notably, one additional component can be installed at the bottom, using the base of the housing as a support shelf 12) as will be described in greater detail below.

Figure 5:
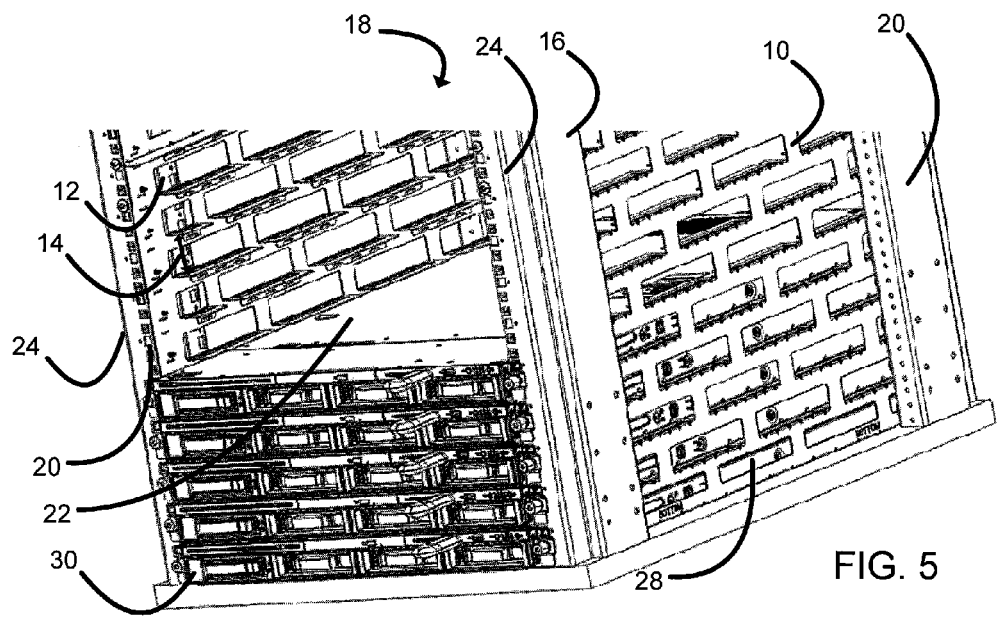
FIG. 5 is a front perspective view of a rack mount system of a first embodiment of the present invention.
Figure 6:
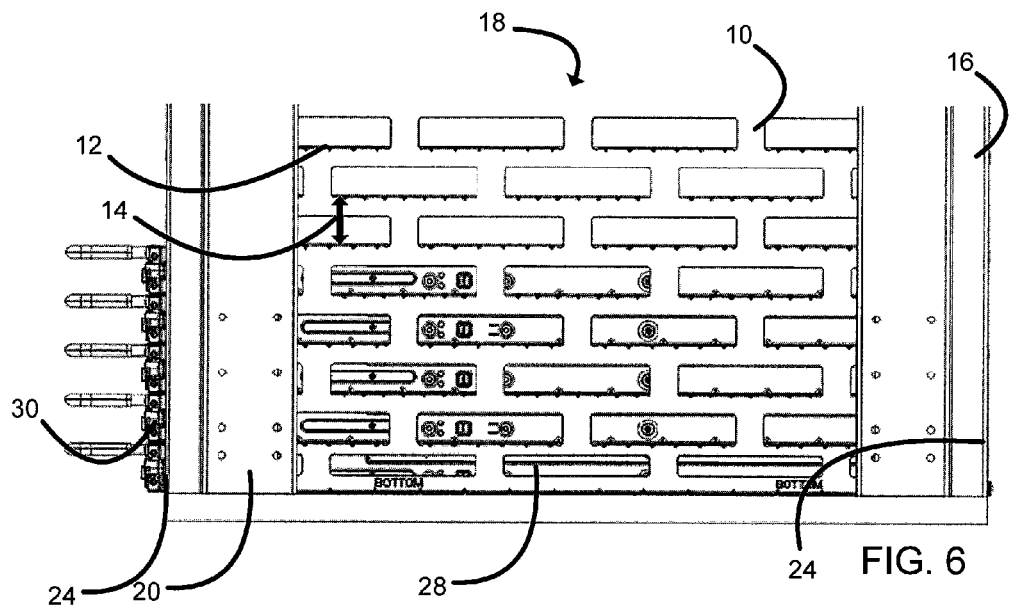
FIG. 6 is a right side view of the rack mount system of FIG. 5.
Figure 7:
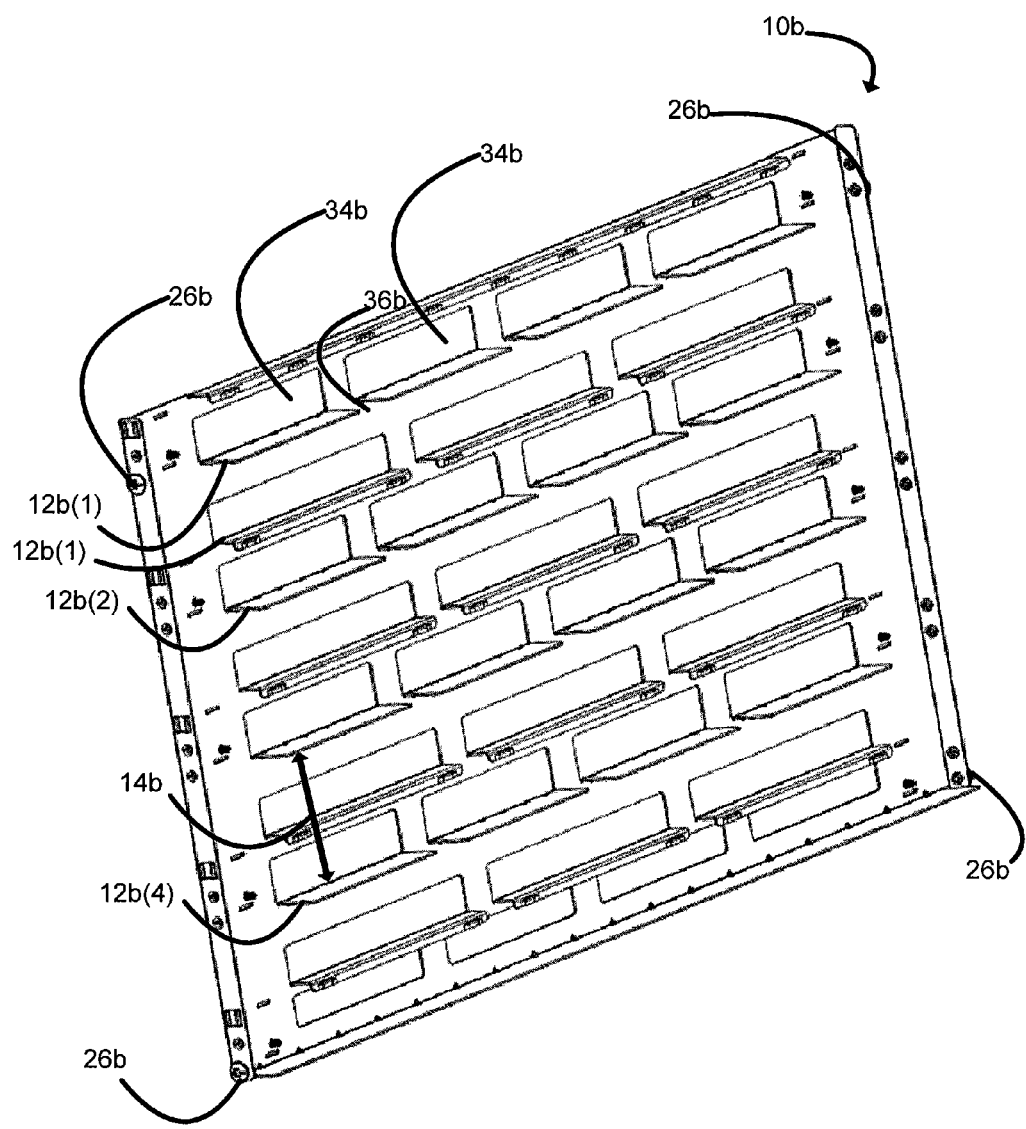
FIG. 7 is a front perspective view of a bulk rail bracket of a second embodiment of the present invention.
Figure 8:
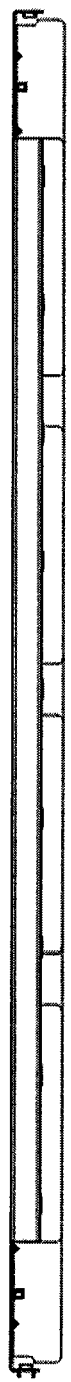
FIG. 8 is a top view of the bulk rail bracket of FIG. 7.
Figure 9:
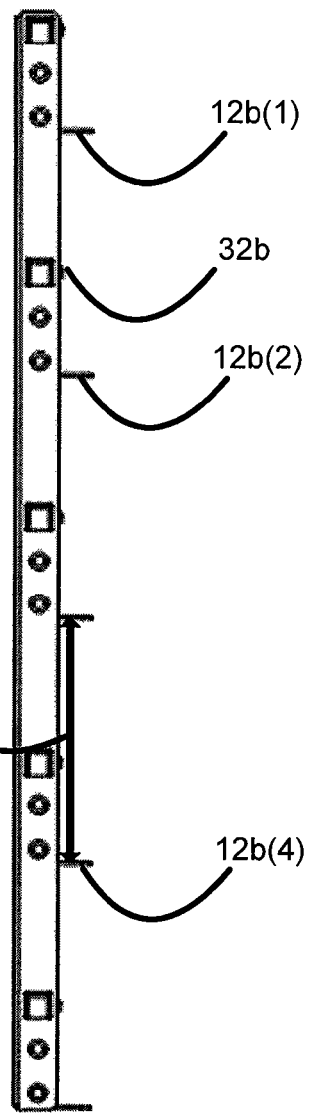
FIG. 9 is a left side view of the bulk rail bracket of FIG. 7, the right side view being a mirror image of the left side view.
Figure 10:
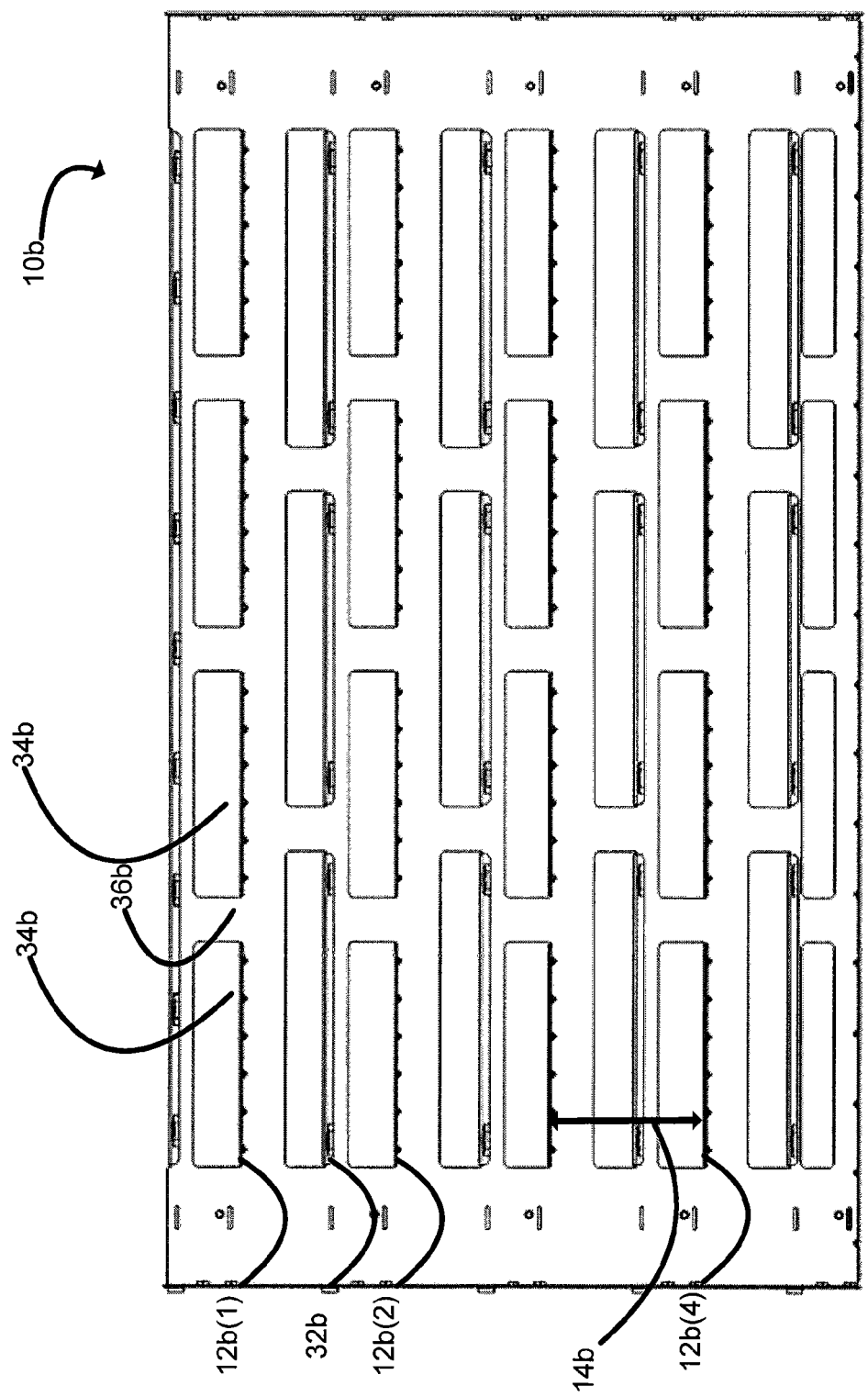
FIG. 10 is a front view of the bulk rail bracket of FIG. 7.

Referring now to FIGS. 5 and 6, to support installation of rack components, two bulk rail brackets 10 are secured within a rack housing 16 of a rack mount system 18. The rack housing 16 includes two generally parallel rack side walls 20 and a rack component opening 22. Each of the two bulk rail brackets 10 is secured adjacent to a corresponding rack side wall 20 such that each support shelf 12 of one of said bulk rail brackets is aligned with each corresponding support shelf 12 of the other bulk rail bracket. One example technique of securing the bulk rail bracket 10 to the housing 16 is by using fasteners, although other known techniques (e.g., welding, tabs, or pins) are also considered. In the example embodiment shown in FIGS. 5 and 6, the rack housing 16 includes four vertically-oriented and generally parallel mounting brackets 24 secured generally along each corner of the rack housing 16 (again, using fasteners, by welding, tabs, or pins). As shown in FIGS. 5 and 6, the bulk rail bracket 10 is secured to the rack housing 16 using a fastener 26 (e.g., a screw) that secures each bulk rails bracket to the two corresponding mounting brackets 24.

As described above, one of the advantages of the present invention over the prior art is to reduce the amount of hardware required to assemble a rack mount system. In the example embodiment shown in FIGS. 5 and 6, each said bulk rail bracket 10 is secured to the two corresponding mounting brackets 24 using four fasteners 26 (FIG. 1). As such, the bulk rail brackets 10 (which support a plurality, and often a substantial number of components), only require a total of eight fasteners 26 to be secured to the rack housing 16.

Once the bulk rail brackets 10 are secured within the rack housing 16, a user can insert a rack component 28 though the rack opening 22, such that the bottom of the rack component slides along the aligned support shelf rows 12 of the two bulk rail brackets. Once the rack component 28 is fully inserted, additional fasteners 26 are used to secure the front panel 30 of the rack component to the mounting bracket 24

As noted above, the support shelf rows 12 are spaced by a multiple of a rack unit size. This allows for bulk rack brackets 10 to be customized to allow for installation of various numbers and sizes of rack components. For example, as shown in FIGS. 7-10, the bulk rail bracket 10b is configured to receive 2U-sized components. As such, the bulk rail bracket 12b has four support shelf rows 12b that are spaced as a height 14b of two times the 1.75 inch rack unit size (in this example, approximately 3.5 inches). The 2U bulk rail bracket also includes horizontally-oriented guide shelves rows 32b disposed between each pair of support shelf rows 12b to help guide and position the rack component when it is being inserted along the support shelf rows (one guide shelf row 32b between support shelf rows 12b(1) and 12b(2) is labeled in FIGS. 7, 9, and 10). The width of the guide shelf rows 32b is less than the width of the support shelf rows 12b so that it does not prevent the rack component from being inserted into the rack component opening 22 (the support shelf rows 12b are wider so that they extend under the rack component to support it). In one example embodiment, the guide shelf row has a width of 17.669 inches, while the support shelf rows have a width of 16.835 inches.

The support shelf rows 12 and the guide shelf rows 32 in the two examples shown are configured such that they each includes a plurality of support shelf subshelves 34 separated from each other by a gap 36 (the first two subshelves 34 and the interviewing gap 36 on the first support shelf row 12 is labeled in FIGS. 1, 4, 7, and 10). Such a design allows the support shelf rows 12 and the guide shelf rows 32 to perform their intended function, but while using a reduced amount of material (i.e., as opposed to being continuous shelves with no gaps). Further, while the two example bulk rail brackets 10 have been described with the first example including pairs of support shelf rows 12 that are spaced for 1U components, and the second example including pairs of support shelf rows 12b that are spaced for 2U components, the invention is not so limited. Indeed, the present bulk rail brackets 10 can be spaced for any multiple of a rack unit size and can also be configured to include a mix of such sizes. For example, a bulk rail unit 10 could support ten 1U rack components and fifteen 1U rack components. As such, the present bulk rail bracket 10 is customizable so that it can be tailored to particular rack mounting needs.

Throughout this description, any reference to "a," "an," or "the" should be construed as "at least one" unless otherwise noted. While particular embodiments of a bulk rail bracket have been described herein, it will be appreciated by those skilled in the art that changes and modifications may be made thereto without departing from the invention in its broader aspects and as set forth in the following claims.

What is claimed is:

1. A bulk rail bracket comprising:
   at least three horizontally-oriented and vertically aligned discontinuous support shelf rows, wherein each support shelf row includes at least three horizontally aligned support subshelves separated by horizontal gaps, and wherein at least one of the support shelf rows is separated from a consecutive support shelf row by a vertical gap of a whole number multiple of a rack unit height, wherein the whole number is greater than one;
   at least one horizontally-oriented and vertically aligned discontinuous guide shelf row disposed within the vertical gap, wherein the at least one guide shelf row is continuous along at least a portion of the bulk rail bracket vertically aligned with the horizontal gaps; and
   wherein the bulk rail bracket is configured to receive and permit removal of a rack component by sliding the rack component horizontally along and in contact with one of the support shelf rows and the bulk rail bracket within the vertical gap.

2. The bulk rail bracket of claim 1 wherein the bulk rail bracket is configured to be secured about its periphery to two vertically oriented mounting brackets, wherein the mounting brackets are secured to each corner of a rack housing.

3. The bulk rail bracket of claim 1 wherein the vertical gap is two rack unit heights.

4. The bulk rail bracket of claim 1 wherein another one of the support shelf rows is separated from a consecutive discontinuous support shelf row by a vertical gap of one rack unit height.

5. The bulk rail bracket of claim 1 wherein the guide shelf row includes a plurality of subguide shelves separated from each other, wherein the plurality of subguide shelves are continuous along at least a portion of the bulk rail bracket vertically aligned with the horizontal gaps of the consecutive discontinuous support shelf row.

6. The bulk rail bracket of claim 1 wherein the discontinuous guide shelf row has a width that is less than a width of any support shelf row of the at least three of the discontinuous support shelf rows.

7. A rack mount system comprising:
   a first bulk rail bracket and a second bulk rail bracket, each of the first and second bulk rail brackets including:
      at least three horizontally-oriented and vertically aligned discontinuous support shelf rows, wherein each support shelf row includes at least three horizontally aligned support subshelves separated by horizontal gaps, and wherein each support shelf row is separated from a consecutive support shelf row by a vertical gap of a whole number multiple of a rack unit height, wherein the whole number is greater than one; and at least one horizontally-oriented and vertically aligned discontinuous guide shelf row disposed within the vertical gap, wherein the at least one guide shelf row is narrower than each support shelf row, and wherein the at least one guide shelf row is continuous along at least a portion of the bulk rail bracket vertically aligned with the horizontal gaps; and a rack housing having two generally parallel rack side walls and a rack component opening, wherein each of the first and second bulk rail brackets is configured to receive and permit removal of a rack component by sliding the rack component horizontally along and in contact with one of the support shelf rows and the bulk rail bracket within the gap, and wherein each of the first and second bulk rail brackets is secured adjacent to a corresponding rack side wall such that each support shelf row of the first bulk rail bracket is aligned with each corresponding support shelf of the second bulk rail bracket, and such that each guide shelf row of the first bulk rail bracket is aligned with each corresponding guide shelf row of the second bulk rail bracket.

8. The rack mount system of claim 7 wherein each of the first and second bulk rail brackets is configured to be secured about its periphery to two vertically oriented mounting brackets, wherein the mounting brackets are secured to each corner of a rack housing.

9. A rack mount system comprising:
two bulk rail brackets, each having:
  at least three horizontally-oriented and vertically aligned discontinuous support shelf rows, wherein each support shelf row includes at least three horizontally aligned support subshelves separated by horizontal gaps, and wherein at least one of the support shelf rows is separated from a consecutive support shelf row by a vertical gap of a whole number multiple of a rack unit height, wherein the whole number is greater than one, and at least one horizontally-oriented and vertically aligned discontinuous guide shelf row disposed within the vertical gap, wherein the at least one guide shelf row is continuous along at least a portion of the bulk rail bracket vertically aligned with the horizontal gaps, wherein each bulk rail bracket is configured to receive and permit removal of a rack component by sliding the rack component horizontally along and in contact with one of the discontinuous support shelf rows and the bulk rail bracket within the vertical gap; and a rack housing having two generally parallel rack side walls and a rack component opening, wherein each bulk rail bracket is secured adjacent to a corresponding rack side wall such that each discontinuous support shelf of one of the bulk rail brackets is aligned with each corresponding discontinuous support shelf of the other bulk rail bracket, and wherein the rack housing includes four vertically-oriented and generally parallel mounting brackets secured generally along each corner of the rack housing, and wherein each bulk rail bracket is secured to one of the two corresponding mounting brackets using four fasteners.

10. The rack mount system of claim 9 wherein each bulk rail bracket is configured to be secured about its periphery to the two vertically oriented mounting brackets, wherein the mounting brackets are secured to each corner of the rack housing.

11. The bulk rail brackets of claim 9 wherein the bulk rail brackets are configured to accommodate a number of rack components corresponding to a rack component capacity associated with the rack housing.

12. The bulk rail brackets of claim 9 wherein the vertical gap is two rack unit heights.

13. The bulk rail brackets of claim 9 wherein each guide shelf row includes a plurality of subguide shelves separated from each other by a distance.

* * * * *